(12) United States Patent
Suto et al.

(10) Patent No.: US 8,064,218 B2
(45) Date of Patent: Nov. 22, 2011

(54) MULTILAYER WIRING BOARD AND ELECTRICAL CONNECTING APPARATUS USING THE SAME

(75) Inventors: Naoki Suto, Hirosaki (JP); Akitsugu Yamaguchi, Hirakawa (JP)

(73) Assignee: Kabushiki Kaisha Nihon Micronics, Musahino-shi, Tokyo (JP)

( * ) Notice: Subject to any disclaimer, the term of this patent is extended or adjusted under 35 U.S.C. 154(b) by 404 days.

(21) Appl. No.: 12/365,071

(22) Filed: Feb. 3, 2009

(65) Prior Publication Data

US 2009/0242254 A1  Oct. 1, 2009

(30) Foreign Application Priority Data

Mar. 25, 2008  (JP) .................. 2008-077791

(51) Int. Cl.
*H01R 9/00*  (2006.01)
(52) U.S. Cl. ...................................... 361/772
(58) Field of Classification Search .......... 361/772–774, 361/782, 792, 767; 174/260–264
See application file for complete search history.

(56) References Cited

U.S. PATENT DOCUMENTS
6,825,900 B2 * 11/2004 Kawashima .................. 349/106

FOREIGN PATENT DOCUMENTS

| JP | 5218218 | 8/1993 |
|----|---------|--------|
| JP | 5218218 A | 8/1993 |
| JP | 6152141 | 5/1994 |
| JP | 6152141 A | 5/1994 |
| JP | 2961859 | 10/1999 |
| JP | 2961859 B2 | 10/1999 |
| JP | 2006120738 | 5/2006 |
| JP | 2006120738 A | 5/2006 |

* cited by examiner

*Primary Examiner* — Phuong Dinh
(74) *Attorney, Agent, or Firm* — Ingrassia Fisher & Lorenz, P.C.

(57) ABSTRACT

The present invention makes repair easy and reduces effects on the electrical connection conditions of an electronic component to an internal wiring after repair and on the mechanical strength of the repair part in a case of breakage or separation of an electrode for implementation of the electronic component. In a multilayer wiring board, a plurality of wiring sheets each having an internal wiring and a plurality of electrical insulating sheets are arranged alternately in the thickness directions of these sheets, and a plurality of electrodes for implementing an electronic component electrically connected to the internal wirings are formed on the surface of an uppermost sheet. The multilayer wiring board further comprises a plurality of spare electrodes corresponding to the electrodes and electrically connected to the internal wirings connected to the corresponding electrodes directly under the corresponding electrodes on a sheet located directly under the uppermost sheet.

7 Claims, 7 Drawing Sheets

MULTILAYER WIRING BOARD AND ELECTRICAL CONNECTING APPARATUS USING THE SAME

TECHNICAL FIELD

The present invention relates to a multilayer wiring board that can implement an electronic component such as an integrated circuit, a capacitor, a resistor, a relay, or the like on the upper surface and an electrical connecting apparatus using the same.

BACKGROUND ART

As examples of wiring boards of this kind, there are ones described in Patent Literature 1 to 4. One of them is shown in FIG. 7, which is an enlarged cross-sectional view of the proximity of an electronic component implemented on the upper surface of the multilayer wiring board.

Referring to FIG. 7, a multilayer wiring board 110 comprises a plurality of wiring sheets 112a, 112b and a plurality of electrical insulating sheets 114a, 114b, 114c, and these sheets 112a, 112b, 114a, 114b, 114c are layered alternately in their thickness directions.

Although only two wiring sheets 112a, 112b and only three electrical insulating sheets 114a, 114b, 114c are shown in the example shown in the figure, the multilayer wiring board 110 may comprise more wiring sheets and more electrical insulating sheets.

Each of the wiring sheets 112a, 112b comprises a sheet-like member made of ceramic, polyimide resin, or the like and a plurality of internal wirings 116 made of a conductive material such as copper at least on the upper surface of the sheet-like member.

Each of the electrical insulating sheets 114a, 114b, 114c is made of an adhesive material such as polyimide resin and is piled up over one of the wiring sheets 112a, 112b to cover the internal wirings 116.

The electrical insulating sheet 114a located at the uppermost layer of the multilayer wiring board 110 has a plurality of electrodes 122 to implement the electronic component 120 on the upper surface of the multilayer wiring board 110 (the electrical insulating sheet 114a). Each electrode 122 shapes an annular or rectangular flat land.

Each internal wiring 116 of the wiring sheets 112a, 112b and each electrode 122 of the uppermost electrical insulating sheet 114a are electrically connected by a conductive portion 124 such as a conductive through hole penetrating the multilayer wiring board 110 in the board thickness direction.

Although only one set consisting of two electrodes 122, two conductive portions 124, and one electronic component 120 is shown in the example shown in the figure, more and multiple sets each consisting of electrodes, conductive portions, and an electronic component are actually provided.

Each electrode 122 has a foot pattern 126 formed on the upper surface of the uppermost electrical insulating sheet 114a in a layer shape made of a conductive material such as copper and a connection land 128 formed on the upper surface of the foot pattern 126 to implement the electronic component 120.

Each electronic component 120 has a component main body 130 and a pair of terminals 132 protruded from both the ends of the component main body 130 and is attached to the adjacent electrodes 122 at both the terminals 132 by jointing materials 134 such as solder, conductive adhesive, or the like.

In the example shown in the figure, the electrical insulating sheet 114c located at the lowermost layer of the multilayer wiring board 110 also has a plurality of electrodes 136 on its lower surface. Each electrode 136 is electrically connected to the conductive portion 124 and is electrically connected to another board arranged on the lower side of the multilayer wiring board 110. Although only two electrodes 136 are shown in the example shown in the figure, more electrodes 136 or as many electrodes 136 as the number of the conductive portions 124 are actually provided.

In the multilayer wiring board 110 of this kind, the foot pattern 126 may be separated from the uppermost electrical insulating sheet 114a due to lack of close contact (especially, adhesiveness) between the foot pattern 126 (or the electrode 122) and the uppermost electrical insulating sheet 114a, impact applied to the multilayer wiring board 110, etc.

When the foot pattern 126 is separated as above, failures occur such as breakage of the connection land 128 formed on the foot pattern 126 or breakage of the electrode 122 itself or separation of it from the electrical insulating sheet 114a due to separation of the connection land 128 together with the foot pattern 126 from the electrical insulating sheet 114a.

As a result, in the conventional multilayer wiring board 110, the electronic component 120 is electrically separated from the internal wiring 116 or comes off from the multilayer wiring board 110, and the multilayer wiring board 110 and an apparatus equipped with this cannot be used.

When the electrode 122 is broken or separated as above, fixing or repair for electrically connecting the electronic component 120 attached to the broken or separated electrode 122 to the corresponding internal wiring 116 is done.

In the conventional multilayer wiring board 110, since the electrodes 122 are just provided in the uppermost electrical insulating sheet 114a, repair is inevitably done by means of keeping the broken or separated electrode 122, especially the foot pattern 126, on the electrical insulating sheet 114a by covering it with resin or soldering a material such as copper foil to the connection land 128 separated together with the foot pattern 126.

However, the above repair method requires a great deal of labor and skills for the repair work and causes problems of adverse effects on the electrical connection characteristics such as impedance matching between the electronic component 120 and the electrode 122 after repair and on the mechanical strength of the repair part and its proximity.

The aforementioned breakage or separation of the electrode 122 occurs not only in a case where the electrode 122 consists of the foot pattern 126 and the connection land 128 but also in a case where the electrode 122 is formed to be a single layer.

Patent Literature 1: Japanese Patent Appln. Public Disclosure No. 5-218218
Patent Literature 2: Japanese Patent Appln. Public Disclosure No. 6-152141
Patent Literature 3: Japanese Patent No. 2961859
Patent Literature 4: Japanese Patent Appln. Public Disclosure No. 2006-120738

SUMMARY OF INVENTION

Technical Problem

It is an object of the present invention to facilitate repair and reduce effects on the electrical connection conditions of an electronic component to an internal wiring after repair and on the mechanical strength of the repair part in a case of breakage or separation of an electrode for implementation of the electronic component.

Solution to Problem

A multilayer wiring board according to the present invention comprises a plurality of wiring sheets each having an internal wiring and a plurality of electrical insulating sheets, wherein both the sheets are arranged alternately in the thickness directions of these sheets, and wherein a plurality of electrodes for implementing an electronic component electrically connected to the internal wirings are formed on the surface of an uppermost sheet.

Such a multilayer wiring board further comprises a plurality of spare or auxiliary electrodes corresponding to the electrodes for implementing the electronic component, that is, the main electrodes, and provided on the sheet located directly under the uppermost sheet so as to be electrically connected to the internal wirings connected to the electrodes for implementing the electronic component (the main electrodes) directly under the electrodes for implementing the electronic component (the main electrodes) corresponding to the spare electrodes.

The electrodes for implementation (the main electrodes) and the spare electrodes corresponding to these may be electrically connected by conductive members penetrating the wiring sheets and the electrical insulating sheets in their thickness directions.

The spare electrodes may be formed on the upper surface of the sheet located directly under the uppermost sheet.

Another sheet may be formed on the upper surface of the uppermost sheet on which the electrodes for implementation (the main electrodes) are formed.

An electrical connecting apparatus according to the present invention comprises the aforementioned multilayer wiring board and a plurality of electronic components arranged on the upper surface of the multilayer wiring board in a state of being electrically connected to the electrodes for implementation of the multilayer wiring board.

The electrical connecting apparatus may further comprise a plate-shaped board arranged on the lower side of the multilayer wiring board and having internal wirings electrically connected to the internal wirings of the wiring board and contactors arranged on the lower side of the plate-shaped board and electrically connected to the internal wirings of the plate-shaped board.

The plate-shaped board may comprise a ceramic board arranged on the lower side of the multilayer wiring board and having internal wirings electrically connected to the internal wirings of the multilayer wiring board and a probe board arranged on the lower side of the ceramic board and having internal wirings electrically connected to the internal wirings of the ceramic board.

Advantageous Effects of Invention

According to the present invention, in the multilayer wiring board, the spare electrodes having the same function as that of the electrodes for implementing the electronic component are formed on the sheet directly under the uppermost wiring sheet. Accordingly, in a case of failure or breakage of an electrode for implementation, the part can be removed to expose the spare electrode, and the electronic component can be newly implemented on the exposed spare electrode, which facilitates repair.

Also, according to the present invention, the spare electrode is electrically connected to the internal wiring to which the corresponding electrode for implementation is connected. Consequently, even when the broken or separated electrode for implementation is removed, effects on the electrical connection characteristics of the electronic component to the internal wiring after repair and on the mechanical strength of the repair part are reduced.

DESCRIPTION OF EMBODIMENTS

Definition of Terms

In the present invention, in the thickness direction of a multilayer wiring board, a side to which an electronic component is implemented is referred to as an upper side, and an opposite side of it is referred to as a lower side. However, at the time of use, the multilayer wiring board may be used in any state in which such an up-down direction is reverse, vertical, or diagonal.

Embodiments of Multilayer Wiring Board

Figure 1:
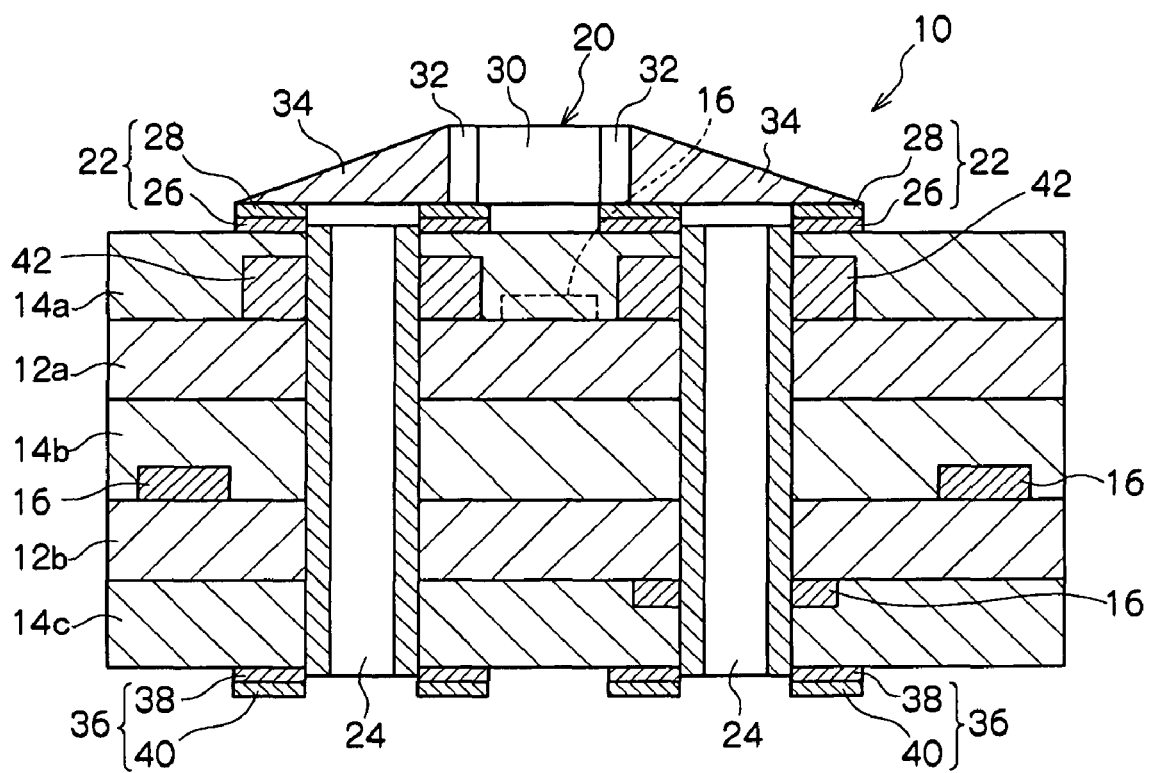
FIG. 1 is a cross-sectional view showing an embodiment of a multilayer wiring board according to the present invention in which the proximity of an electronic component implemented on the upper surface is enlarged.

Referring to FIG. 1, in a multilayer wiring board 10, a plurality of wiring sheets 12a, 12b and a plurality of electrical insulating sheets 14a, 14b, 14c are layered alternately in the thickness directions of these sheets 12a, 12b, 14a, 14b, 14c and are formed in plate shapes.

Although only two wiring sheets 12a, 12b and only three electrical insulating sheets 14a, 14b, 14c are shown in the example shown in the figure, the multilayer wiring board 10 may comprise more and multiple wiring sheets and more electrical insulating sheets.

Each of the wiring sheets 12a, 12b is provided with a plurality of internal wirings 16 made of a conductive material such as copper at least on the upper surface of an electrical insulating sheet layer such as epoxy resin containing glass, ceramic, polyimide resin, or the like. Each internal wiring 16 is a part of a wiring pattern formed on the aforementioned sheet layer by an appropriate technique such as a printing technique.

Each of the electrical insulating sheets 14a, 14b, 14c is formed in a layer shape made of an adhesive material such as polyimide resin and is overlapped on the wiring sheets 12 to cover the internal wirings 16.

The electrical insulating sheet 14a located at the uppermost layer of the multilayer wiring board 10 has a plurality of electrodes 22 on the upper surface to implement the electronic component 20. Although only one electronic component 20 and only a pair of electrodes 22 are shown in the example shown in the figure, more and multiple electronic components and electrodes are actually provided.

Each electrode 22 is electrically connected to any one of the internal wirings 16 by a conductive portion 24 such as a conductive through hole penetrating the multilayer wiring board 10 in the thickness direction. Each conductive portion 24 is made of a metal material with high conductivity (a conductive member) such as copper.

Each electrode 22 is made to be an annular or rectangular flat land by forming a layer-shaped foot pattern 26 on the upper surface of the uppermost electrical insulating sheet 14 with a conductive material such as copper and forming a connection land 28 to implement or mount the electronic component 20 thereon on the upper surface of the foot pattern 26 with a highly conductive metal material such as silver or gold.

Each electrode 22 is electrically connected at least at the foot pattern 26 to the internal wiring 16 via the corresponding conductive portion 24. Thus, the foot pattern 26 may be made of the same material as the conductive portion 24.

Each electronic component 20 has a component main body 30 and a pair of terminals 32 protruded from the component main body 30 and is attached to the adjacent electrodes 22 at the terminals 32 by jointing materials 34 such as solder or conductive adhesive.

In the example shown in the figure, the electrical insulating sheet 14 located at the lowermost layer also has a plurality of electrodes 36 on its lower surface. Each electrode 36 is electrically connected to another board such as a ceramic board or a probe board arranged on the lower side of the multilayer wiring board 10.

Each electrode 36 is also made to be an annular or rectangular flat land by forming a layer-shaped foot pattern 38 on the lower surface of the lowermost electrical insulating sheet 14 with a conductive material such as copper and forming a connection land 40 to be connected to another board on the lower surface of the foot pattern 38 with a highly conductive metal material such as silver or gold. Each electrode 36 is electrically connected at least at the foot pattern 38 to the corresponding internal wiring 16 via the corresponding conductive portion 24.

Also, in the multilayer wiring board 10, a spare electrode 42 corresponding to each electrode 22 is arranged directly under the corresponding electrode 22. Although only one pair of electrodes 42 is shown in the example shown in the figure, as many spare electrodes as the number of the electrodes 22 or more are actually provided.

The spare electrode 42 is provided on the upper surface of the wiring sheet 12a located directly under the uppermost electrical insulating sheet 14a and is electrically connected to the internal wiring 16 to which the corresponding electrode 22 is connected via the corresponding conductive portion 24.

The spare electrode 42 can be formed on the upper surface of the wiring sheet 12a directly under the uppermost electrical insulating sheet 14a by an appropriate technique such as a printing technique using a highly conductive metal material such as gold, silver, copper, or the like before the electrical insulating sheet 14a comprising the electrode 22 is formed on the wiring sheet 12a directly under it.

Figure 2:
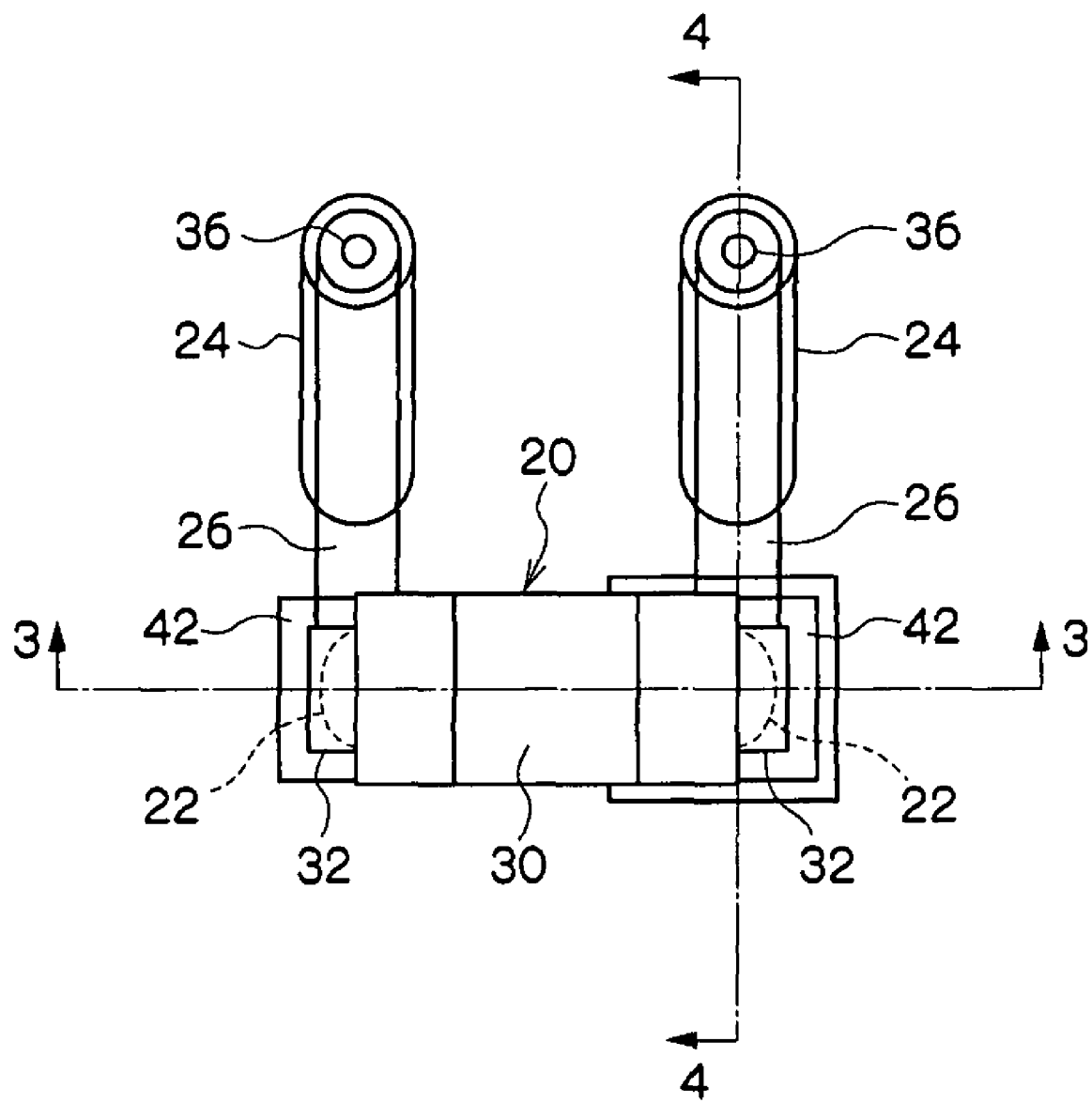
FIG. 2 is a plan view schematically showing the relationship of the electronic component, the electrodes, and the conductive portions in a state where the wiring sheet and the electrical insulating sheet have been removed.

The relationship of the electronic component 20, the electrodes 22, the conductive portions 24, and the internal wirings 16 in the multilayer wiring board 10 is schematically shown in FIG. 2. FIG. 2 is a plan view shown in a state where the wiring sheet 12a and the electrical insulating sheet 14a have been removed.

The electronic component 20 mounts its each terminal 32 on the corresponding electrode 22 and attaches it to the corresponding electrode 22 by a jointing material 34 (not shown in FIG. 2) such as solder or conductive adhesive so as to be electrically connected to these terminals 22.

In the multilayer wiring board 10 as well, it is inevitable that the foot pattern 26 is separated from the uppermost electrical insulating sheet 14a due to lack of close contact (especially, adhesiveness) between the foot pattern 26 (or the electrode 22) and the uppermost electrical insulating sheet 14a, impact applied to the multilayer wiring board 10, etc.

When the foot pattern 26 is separated as above, the connection land 28 is broken or is separated together with the foot pattern 26 from the uppermost electrical insulating sheet 14a. As a result, failures of the electrode 22 occur such as breakage of the electrode 22 itself or separation of the electrode 22 from the electrical insulating sheet 14a.

Accordingly, in the multilayer wiring board 10 as well, fixing or repair for electrically connecting the electronic component 20 attached to the broken or separated electrode 22 to the corresponding internal wiring 16 is done.

Figure 3:
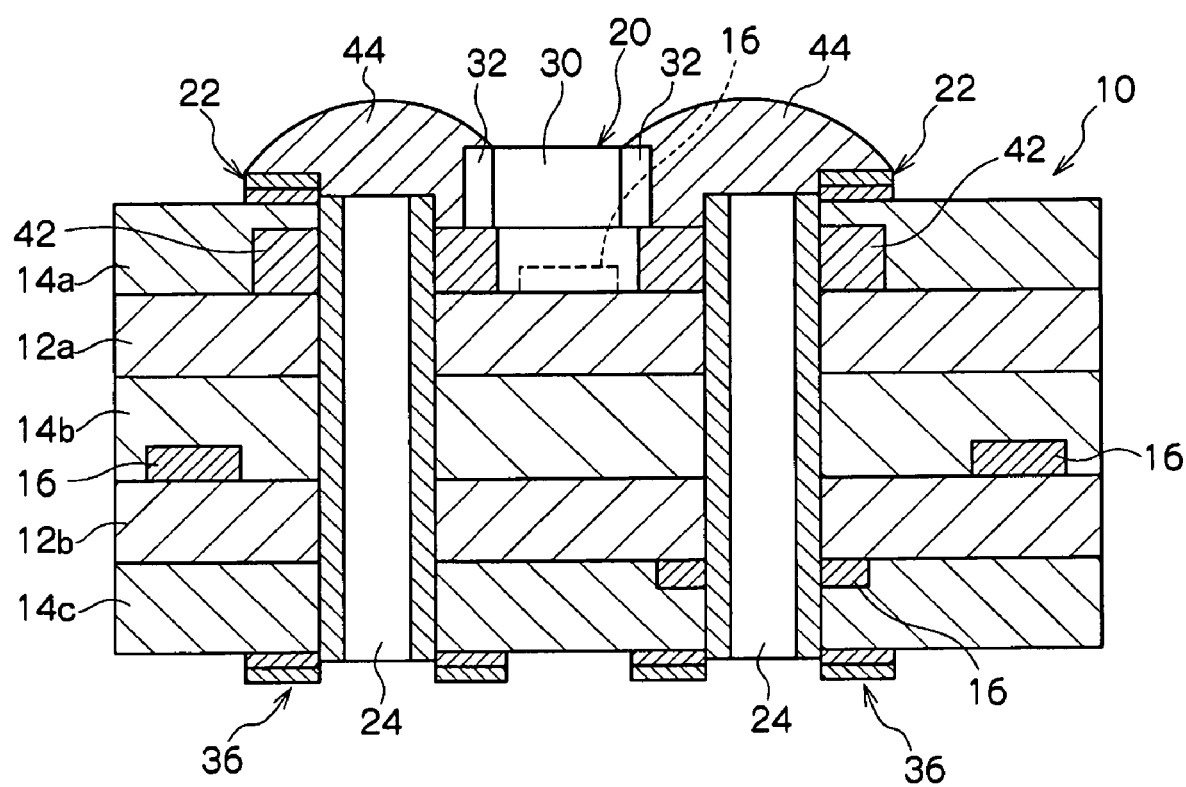
FIG. 3 is an enlarged cross-sectional view obtained along the line 3-3 in FIG. 2 showing the state after repair.
Figure 4:
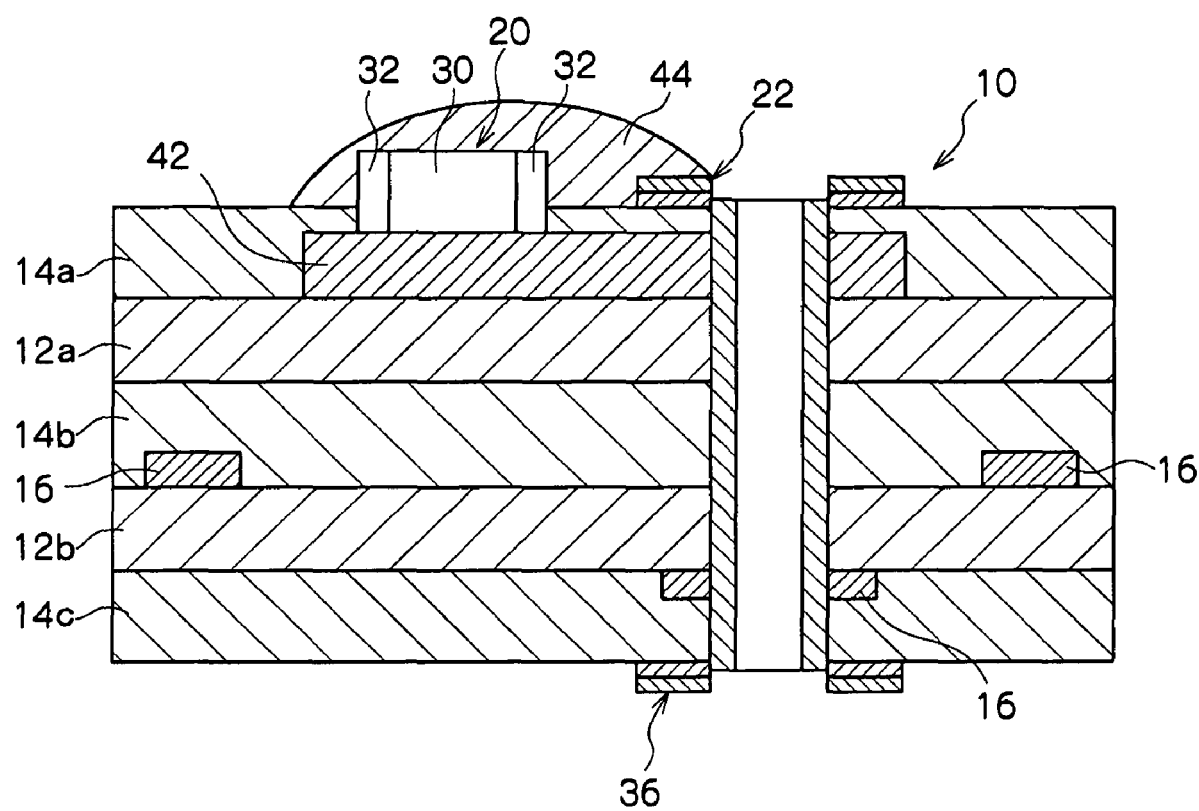
FIG. 4 is an enlarged cross-sectional view obtained along the line 4-4 in FIG. 2 showing the state after repair.

Such repair can be done as shown in FIGS. 3 and 4 since the spare electrode 42 is provided directly under the electrode 22 in a case of the multilayer wiring board 10. The procedure of the repair is explained as follows.

Embodiments of Repair Method

First, the existing jointing material 34 (refer to FIG. 1) is removed, and the electronic component 20 attached to the failed electrode 22 is detached from the electrode 22 and the adjacent electrode 22.

Next, the respective parts (or all) of the failed electrode 22 and the adjacent electrode 22 and the material of the uppermost sheet 14 around them are removed by a technique such as a chipping process using an appropriate means such as laser beam, and the two spare electrodes 42 corresponding to these electrodes 22 are exposed upward.

Next, under a state where each terminal 32 of the electronic component 20 is mounted on the exposed spare electrode 42, jointing materials 44 such as solder or conductive adhesive are applied and raised in the spaces from which the parts or all of the electrodes and the material of the uppermost sheet 14a around them have been removed, and thus the electronic component 20 is electrically connected to each spare electrode 42 by attaching its each terminal 32 to each spare electrode 42 with the jointing material 44.

In the multilayer wiring board 10, repair can be done only by operations such as detachment of the electronic component 20 from the failed electrode 22, exposure of the corresponding spare electrode 42 by removal of the failed electrode 22 and the material around it, and attachment of the electronic component 20 to the exposed spare electrode 42 as described above. Thus, the repair work is significantly easier than that in the conventional multilayer wiring board.

Also, in the multilayer wiring board 10, since the spare electrode 42 itself is electrically connected to the internal wiring 16 via the conductive portion 24, the electronic component 20 attached to the spare electrode 42 is also electrically connected to the internal wiring 16 via the spare electrode 42 and the conductive portion 24. Consequently, even when the broken or separated electrode 22 is removed, effects on the electrical connection conditions of the electronic component 20 to the internal wiring 16 after repair and on the mechanical strength of the repair part are reduced more than in the conventional multilayer wiring board.

Embodiments of Electrical Connecting Apparatus

Figure 5:
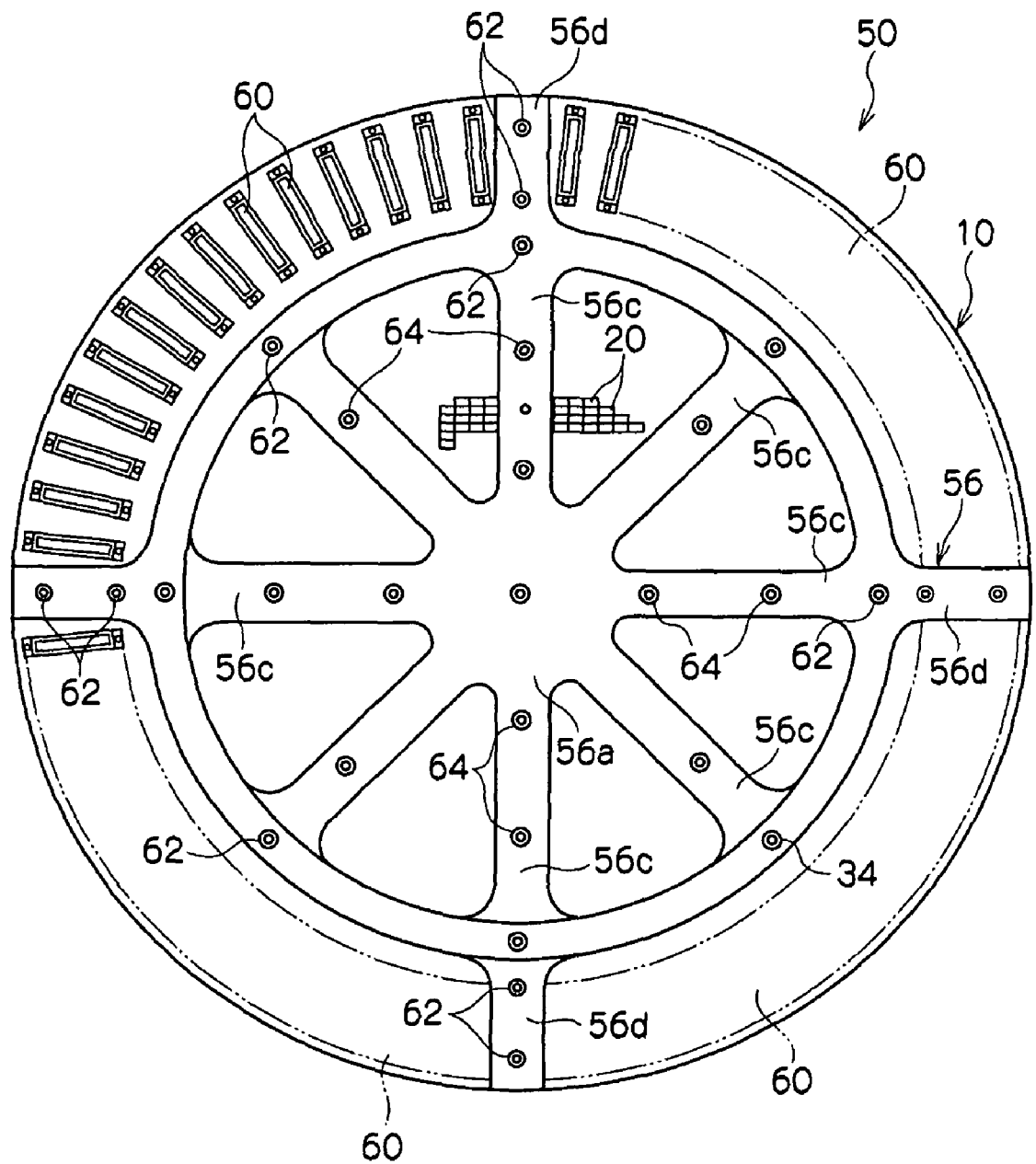
FIG. 5 is a plan view showing an embodiment of an electrical connecting apparatus using the multilayer wiring board according to the present invention.
Figure 6:
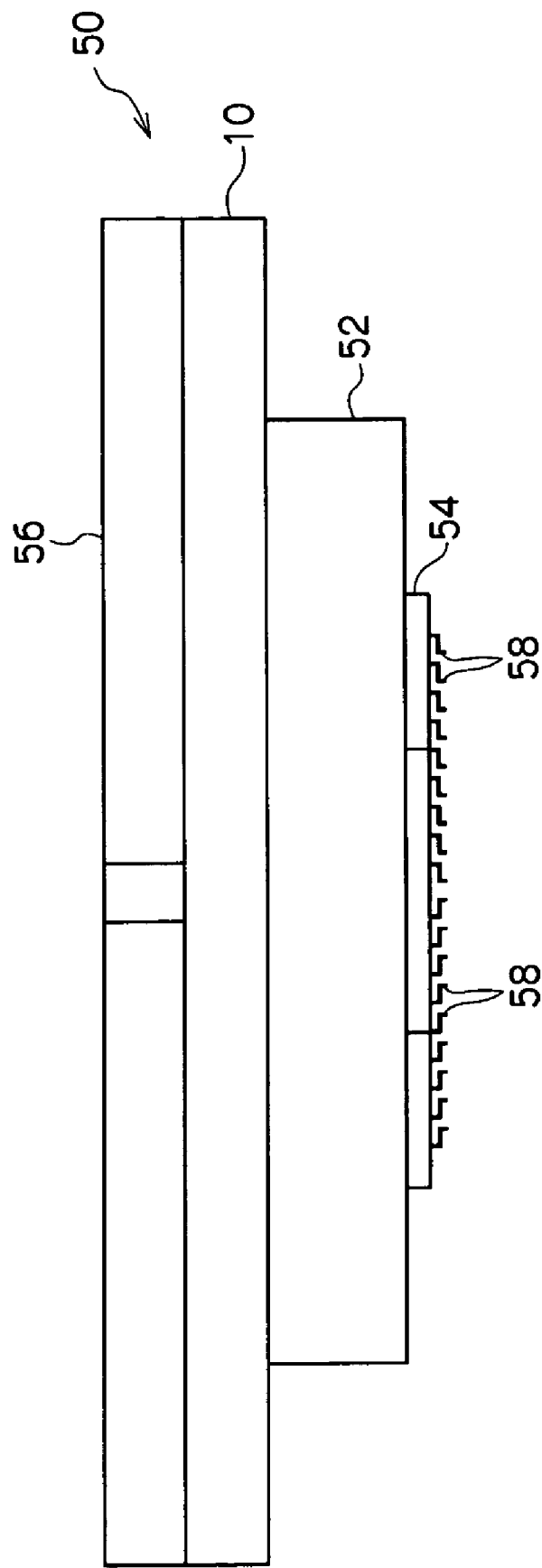
FIG. 6 is a front view of the electrical connecting apparatus shown in FIG. 5.
Figure 7:
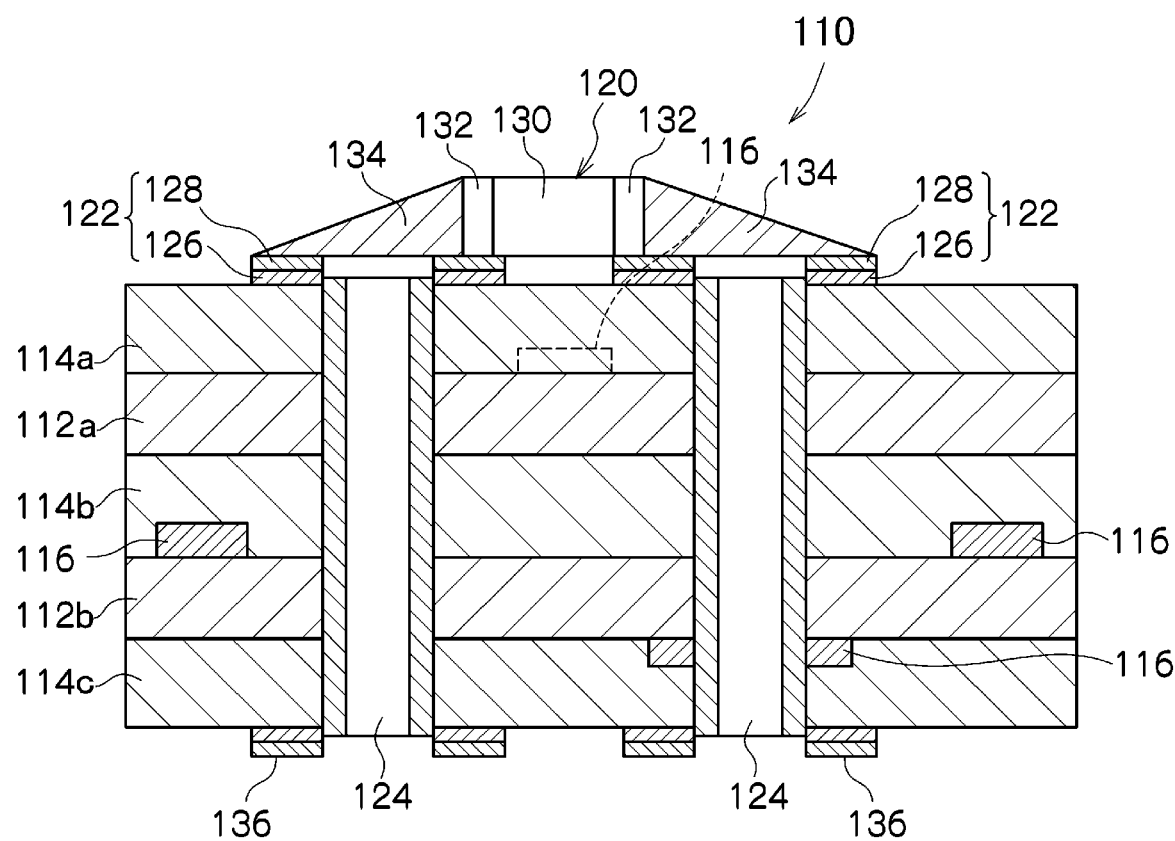
FIG. 7 is a cross-sectional view showing a conventional multilayer wiring board in which the proximity of an electronic component implemented on the upper surface is enlarged.

Referring to FIGS. 5 and 6, an electrical connecting apparatus 50 is used in an electrical test to determine whether or not an integrated circuit (not shown) as a device under test formed on a semiconductor wafer is manufactured in accordance with the specification in order to electrically connect electrodes of the integrated circuit to a tester.

The integrated circuit is an undiced one formed on the semiconductor wafer. The electrical connecting apparatus 50 tests a plurality of undiced integrated circuits formed on the semiconductor wafer at a time or in several batches.

The electrical connecting apparatus 50 includes the aforementioned plate-shaped multilayer wiring board 10, a ceramic board 52 attached to the lower surface of the multilayer wiring board 10, a probe board 54 attached to the lower surface of the ceramic board 52, a support member 56 made of an electrical insulating metal material attached to the upper surface of the multilayer wiring board 10, a plurality of contactors 58 arranged on the lower side of the probe board 54, and a plurality of electronic components 20 arranged on the upper surface of the multilayer wiring board 10.

The multilayer wiring board 10 has a plurality of connectors 60 to be electrically connected to a not shown tester at the outer circumferential portion on the upper surface. Each terminal of each connector 60 is electrically connected to the aforementioned internal wiring 16 directly or via the electronic component 20.

The ceramic board 52 has a plurality of internal wirings (not shown) to be electrically connected to the aforementioned internal wirings 16 of the multilayer wiring board 10 via the aforementioned electrodes 36.

The probe board 54 has a plurality of internal wirings (not shown) electrically connected to the internal wirings of the ceramic board 52 in multiple layers and has a plurality of connection lands electrically connected to these internal wirings on the lower surface. The probe board 54 is attached to the lower surface of the ceramic board 52 by a plurality of screw members (not shown).

The support member 56 is manufactured in a flat-plate-like front surface shape having a flat lower surface with a metal material such as a stainless steel plate and is attached to the upper surface of the multilayer wiring board 10 by a plurality of screw members 62 in a state where its lower surface abuts on the upper surface of the multilayer wiring board 10. These screw members 62 penetrate the support member 56 from the upper side to the lower side and are screwed in the multilayer wiring board 10.

The support member 56 has a circular plate-shaped center portion 56a, an annular portion 56b extending coaxially around the center portion 56a, a plurality of coupling portions 56c extending outward in the radial direction from the center portion 56a and coupling the annular portion 56b, and radial portions 56d integrally continuing to the outside of the annular portion 56b and extending outward in the radial direction from the annular portion 56b, as shown in FIG. 5.

While the flat surface shape of the support member 56 is a shape of a steering wheel of a ship, the front surface shape of the support member 56 seen from the front side is a plate shape. The connectors 60 are arranged on the outside of the annular portion 56b of the support member 56, and the electronic components 20 are arranged in each space on the inside of the annular portion 56b formed by the annular portion 56b and the coupling portions 56c.

Although FIG. 5 shows as if the plurality of electronic components 20 were arranged simply in the two respective spaces formed by the annular portion 56b and the coupling portions 56c, the plurality of electronic components 20 are actually arranged in other such spaces as well.

The support member 56 supports the ceramic board 52 and the probe board 54 in cooperation with the multilayer wiring board 10. Thus, the ceramic board 52 is attached to the support member 56 and the multilayer wiring board 10 by a plurality of screw members 64 penetrating the support member 56 and the multilayer wiring board 10 from the upper side to the lower side and screwed in the ceramic board 52.

The contactor 58 is formed in a plate-like crank-like shape with the probe tip on the lower side and with the attachment portion to the probe board 54 on the upper side. Such a contactor 58 can be manufactured by a photolithographic technique, a deposition technique, etc. The contactor 58 is attached to the connection land of the probe board 54 in a cantilevered manner by a jointing material such as solder or conductive adhesive to bring a state where the probe tip is on the lower side.

The aforementioned electrical connecting apparatus 50 is attached to the tester to be used for electrical connection between electrical circuits of the tester and integrated circuits as devices under test as is well known.

The aforementioned breakage or separation of the electrode occurs not only in a case where the electrode consists of the foot pattern and the connection land but also in a case where the electrode is formed to be a single layer. Thus, the present invention can be applied to a multilayer wiring board comprising single-layer electrodes as well.

Also, in the aforementioned embodiments, the electrical insulating sheet 14a is located at the uppermost layer, and the electrodes 22 are formed on the upper surface of the electrical insulating sheet 14a. However, the present invention can be applied to a multilayer wiring board in which another wiring sheet is located at the uppermost layer, on the upper surface of which the electrodes 22 are formed.

The present invention is not limited to the above embodiments but may be altered in various ways without departing from the spirit and scope of the present invention.

What is claimed is:

1. A multilayer wiring board comprising a plurality of wiring sheets each having an internal wiring and a plurality of electrical insulating sheets wherein both of said wiring sheets and said electrical insulating sheets are arranged alternately in their thickness directions and wherein a plurality of electrodes for implementing an electronic component electrically connected to said internal wirings are formed on the surface of an uppermost electrical insulating sheet, said multilayer wiring board further comprising:

a plurality of auxiliary electrodes corresponding to said electrodes for implementing said electronic component and provided on said wiring sheet located directly under said uppermost electrical insulating sheet so as to be electrically connected to said internal wirings connected to said electrodes for implementing said electronic component; and a conductive portion penetrating the multilayer wiring board in the thickness direction, said conductive portion electrically connecting said auxiliary electrodes to said internal wirings, wherein said auxiliary electrodes are provided directly under said electrodes for implementing said electronic component corresponding to said auxiliary electrodes, said auxiliary electrodes being used in place of said electrodes for implementing said electronic component in case of failure or breakage of said electrodes for implementing said electronic component, by electrically connecting said auxiliary electrodes to said internal wirings with said conductive portion.

2. The multilayer wiring board according to claim 1, wherein said auxiliary electrodes are formed on the upper surface of the sheet located directly under said uppermost sheet.

3. An electrical connecting apparatus comprising:
a multilayer wiring board comprising a plurality of wiring sheets each having an internal wiring and a plurality of electrical insulating sheets wherein both of said wiring sheets and said electrical insulating sheets are arranged alternately in their thickness directions and wherein a plurality of electrodes for implementing an electronic component electrically connected to said internal wirings are formed on the surface of an uppermost electrical insulating sheet, said multilayer wiring board further comprising:
- a plurality of auxiliary electrodes corresponding to said electrodes for implementing said electronic component and provided on said wiring sheet located directly under said uppermost electrical insulating sheet so as to be electrically connected to said internal wirings connected to said electrodes for implementing said electronic component,
   wherein said auxiliary electrodes are provided directly under said electrodes for implementing said electronic component corresponding to said auxiliary electrodes; and
- at least one electronic component implemented on said electrodes for implementing said electronic component of said multilayer wiring board;
- wherein said auxiliary electrodes are used in place of said electrodes for implementing said electronic component in case of failure or breakage of said electrodes for implementing said electrical component, wherein said electrodes for implementing said electronic component and said spare auxiliary electrodes corresponding to said electrodes are electrically connected by conductive members provided to penetrate said wiring sheets and said electrical insulating sheets.

4. The electrical connecting apparatus according to claim 3, wherein said auxiliary electrodes are formed on the upper surface of said sheet located directly under said uppermost sheet.

5. The electrical connecting apparatus according to claim 3, further comprising a board arranged on the lower side of said multilayer wiring board and having internal wirings electrically connected to said internal wirings of said wiring board and contactors arranged on the lower side of said board and electrically connected to said internal wirings of said board.

6. The electrical connecting apparatus according to claim 3, wherein said board arranged on the lower side of said multilayer wiring board comprises a ceramic board having internal wirings electrically connected to said internal wirings of said multilayer wiring board and a probe board arranged on the lower side of said ceramic board and having internal wirings electrically connected to said internal wirings of said ceramic board and provided with said contactors.

7. A multilayer wiring board comprising:
- a plurality of wiring sheets each having an internal wiring;
- a plurality of insulating sheets arranged and layered alternately with said wiring sheets in their thickness directions;
- conductive members penetrating said wiring sheets and said insulating sheets in their thickness directions;
- a plurality of first electrodes arranged on the surface of an uppermost sheet out of said insulating sheets and electrically connected to said corresponding internal wirings via said conductive members for implementing an electronic component on the surface of said uppermost sheet; and
- a plurality of second electrodes provided on said sheet located directly under said uppermost sheet to correspond to said first electrodes and electrically connected to said conductive members to which said corresponding first electrodes are connected,
wherein said second electrodes are exposed by removal of said corresponding first electrodes and partial removal of said uppermost sheet on which said first electrodes are provided, said second electrodes being used in place of said first electrodes, wherein said electrodes for implementing said electronic component and said spare auxiliary electrodes corresponding to said electrodes are electrically connected by conductive members provided to penetrate said wiring sheets and said electrical insulating sheets in case of failure or breakage of said first electrodes.

* * * * *